United States Patent
Perner

(10) Patent No.: US 7,249,301 B2
(45) Date of Patent: Jul. 24, 2007

(54) SEMICONDUCTOR CIRCUIT AND METHOD FOR TESTING, MONITORING AND APPLICATION-NEAR SETTING OF A SEMICONDUCTOR CIRCUIT

(75) Inventor: Martin Perner, München (DE)

(73) Assignee: Infineon Technologies AG, Neubiberg (DE)

(*) Notice: Subject to any disclaimer, the term of this patent is extended or adjusted under 35 U.S.C. 154(b) by 329 days.

(21) Appl. No.: 10/902,105

(22) Filed: Jul. 30, 2004

(65) Prior Publication Data

US 2005/0028058 A1    Feb. 3, 2005

(30) Foreign Application Priority Data

Jul. 30, 2003    (DE) .................. 103 34 801

(51) Int. Cl.
G01R 31/28    (2006.01)
G11C 29/00    (2006.01)

(52) U.S. Cl. .................. 714/733; 718/718
(58) Field of Classification Search .............. None
See application file for complete search history.

(56) References Cited

U.S. PATENT DOCUMENTS

| | | | |
|---|---|---|---|
| 5,764,655 A * | 6/1998 | Kirihata et al. ............. | 714/733 |
| 6,321,320 B1 | 11/2001 | Fleischman et al. | |
| 6,330,681 B1 | 12/2001 | Cote et al. | |
| 6,347,056 B1 | 2/2002 | Ledford et al. | |
| 6,374,370 B1 | 4/2002 | Bockhaus et al. | |
| 6,557,130 B1 | 4/2003 | Krasser et al. | |
| 6,591,389 B1 * | 7/2003 | Daudelin et al. ........... | 714/733 |
| 6,874,111 B1 * | 3/2005 | Adams et al. .............. | 714/733 |
| 6,983,398 B2 * | 1/2006 | Prabhu ...................... | 714/12 |
| 2002/0018379 A1 * | 2/2002 | Hakuchoh et al. .......... | 365/200 |
| 2003/0120974 A1 * | 6/2003 | Adams et al. ................ | 714/31 |
| 2004/0015313 A1 | 1/2004 | Benedix et al. | |
| 2004/0082121 A1 | 4/2004 | Perner | |
| 2004/0100246 A1 | 5/2004 | Perner | |

FOREIGN PATENT DOCUMENTS

WO    WO 02/08904 A2    1/2002

* cited by examiner

*Primary Examiner*—Guy Lamarre
*Assistant Examiner*—John J. Tabone, Jr.
(74) *Attorney, Agent, or Firm*—Edell, Shapiro & Finnan, LLC

(57) ABSTRACT

A semiconductor circuit can have a standard interface for external data, address and/or command interchange in normal operation and a further test interface provided for a test operation with a semiconductor component and with a BIST unit (built-in self-test) assigned to the semiconductor component. The semiconductor circuit can also have a BIST controller for initialization, testing and application-near setting of the semiconductor component, a read-only nonvolatile memory, a programmable nonvolatile memory, and a volatile memory. The processed data stored as operating, test and/or boot parameters in the programmable nonvolatile memory are used during booting and in normal operation for test and configuration purposes for application-near setting of the semiconductor circuit.

34 Claims, 5 Drawing Sheets

FIG 4

| Microcode instruction 18 | | | | | Test vector 19 | | | | | |
|---|---|---|---|---|---|---|---|---|---|---|
| Jump-Control abs/rel. | ALU Fkt. Code | X Bus | Y Bus | Z Bus | I/O Control | Test-Mode | ON/ OFF | Timing* | Levels* | Waveform* | CMDS | Addresses ZXY | DQ-Settings Even/Odd |

(sub-columns under Timing*, Levels*, Waveform*: CMD | Adr | DQ)

181, 182, 183, 184, 191, 192

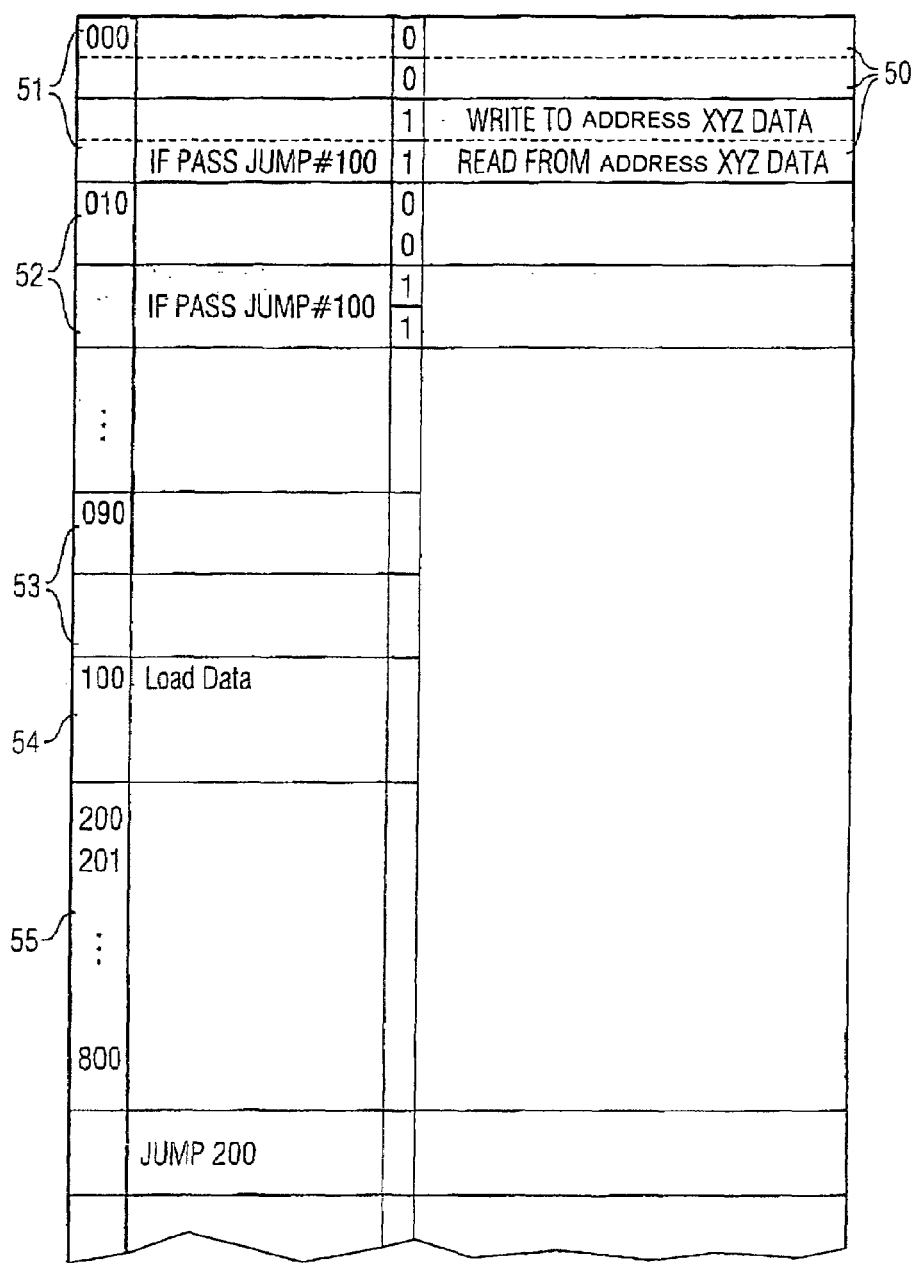

SEMICONDUCTOR CIRCUIT AND METHOD FOR TESTING, MONITORING AND APPLICATION-NEAR SETTING OF A SEMICONDUCTOR CIRCUIT

CROSS REFERENCE TO RELATED APPLICATIONS

This application claims priority under 35 USC §119 to German Application No. DE 10334801.8, filed on Jul. 30, 2003, and titled "Semiconductor Circuit and Method for Testing, Monitoring and Application-Near Setting of a Semiconductor Circuit," the entire contents of which are hereby incorporated by reference.

FIELD OF THE INVENTION

The present invention relates to a semiconductor circuit with a semiconductor component and with a BIST unit assigned to the semiconductor component, and to a method for testing, monitoring and application-near setting of a semiconductor circuit.

BACKGROUND

Integrated semiconductor circuits with semiconductor components, such as DRAMs (Dynamic Random Access Memories) are generally subject to extensive functional tests in the production process. Inter alia, the functional tests serve for identifying defective memory cells or defective column lines or row lines or generally defective circuit sections of the semiconductor component. In order to guarantee an error-free operation of the memory module, the semiconductor components are tested under different operating conditions, for example, predetermined data values being written to memory cells of a memory cell array and subsequently being read out again in order to be compared with the predetermined data values.

Integrated semiconductor circuits often have an integrated switching unit that automatically carries out a functional test of the integrated semiconductor component when the semiconductor circuit is started up. Such a switching unit is referred to according to its function as a BIST (Built-In Self-Test) unit since a microprocessor into which the switching unit is integrated automatically carries out a self-test of its own semiconductor component when it is activated, i.e., supplied with power. The BIST unit has a BIST controller that is integrated as a switching area in the semiconductor circuit as an ASIC (Application Specific Integrated Circuit). Commands issued by the BIST controller are forwarded to the semiconductor component, the BIST controller monitoring and evaluating the execution of the commands. The data communicated by the semiconductor component with regard to its operating states are for example processed by external test systems to form test results that can be used to make a statement about whether and, if appropriate, which memory areas are not functioning as envisaged.

The BIST controller for testing semiconductor components, in particular, for example, dynamic semiconductor memories, is designed such that the cell array can be addressed in a timing-critical manner and binary potential data topologies coded as voltage values can be written to and read from the semiconductor memory in a suitable write/read sequence in an address-dependent manner. In this case, during each read process, the electrically detected and binary represented information is compared with the logically determined expected values. If no incorrect storage is found after a series of positively assessed write/read accesses during the test sequence, the semiconductor component is classified as "pass," otherwise it is regarded as "fail."

The semiconductor circuit may furthermore be connected to an external test apparatus for the purpose of testing, the test apparatus itself generating the test commands required for testing the semiconductor component, namely control commands, address commands, and data values to be stored, and also the required clock signal, and sending the commands via a standard interface of the semiconductor component and reading out the test results.

Test modes including functional tests may enable access to module-relevant parameters or settings and be called up and set with the aid of the BIST controller or via the standard interface of the semiconductor circuit, by an activation known only by the manufacturer. Like the BIST controller, the test modes are also implemented as ASIC in the semiconductor circuit and, consequently, cannot be set flexibly. Consequently, the space that has to be invested for these types of ASICs for test purposes adversely affects the costs in the fabrication of the semiconductor circuit.

In order to obtain a meaningful test result, it is important for the semiconductor component also to be tested at an operating frequency which it has in normal operation. However, it is not possible to directly compare a characteristic mode of operation of the application with the mode of operation of the functional test in order to be able to ascertain whether the integrated circuit has been tested in a manner near the application. Consequently, it is not possible to make a statement about the fact that the circuit tested in the fabrication process has run through all the operating modes that occur in the later application, since it is often the case that many problems are not discovered until during field use and are therefore subsequently corrected only after the development phase.

Various BIST units for testing of microprocessors or for monitoring of functionality and for testing of semiconductor circuits and detection of malfunctions are known in the art.

Further, it is known to store test contents in coded fashion in the form of fuses or other nonvolatile memories on the semiconductor component in order to keep them ready in a module-specific manner for later evaluations during repair or degradation examinations. Moreover, it is known to store the test results obtained by the BIST unit in the semiconductor circuit itself.

In previous test concepts, the BIST unit is used only during testing in production. Operating parameters gathered during the operation of the semiconductor circuit can be analyzed by the manufacturer only when a memory module having a defective semiconductor circuit is returned to the manufacturer. Consequently, characteristic data possibly programmed in, such as, for example, chip ID, test data, or setting parameters can be used only for a historical post-tracking of production, but not for user-specific setting during operation.

A semiconductor circuit that can both be tested and configured in boot mode and be tested, analyzed and set in a manner near the application during normal operation without its function being impaired is desirable. Furthermore, a corresponding method for testing, monitoring and application-near setting of the semiconductor circuit is also desirable.

SUMMARY

A semiconductor circuit, having a standard interface for external data, address and/or command interchange in normal operation and a further test interface provided for a test operation, can have a semiconductor component and a BIST unit assigned to the semiconductor component. The BIST unit can be provided for configuration and for testing of the semiconductor component. The BIST unit can have a controller that controls the configuration and test sequences. According to the invention, a read-only nonvolatile memory assigned to the BIST unit can be provided. A standard program code for configuration and for testing of the semiconductor component, standard test and standard boot parameters can be fetched from the memory. Furthermore, a programmable nonvolatile memory can be provided, which can store a program code for configuration and for testing of the semiconductor component during normal operation, functional tests, operating, test and boot parameters. Upon booting of the semiconductor circuit, either the standard program code or the at least one program code stored in the programmable nonvolatile memory can be loaded for execution in a volatile memory, for example, a RAM, assigned to the BIST controller. The program codes stored in the programmable nonvolatile memory have variably configured test sequences that are adapted for test, monitor or boot purposes.

In this case, the BIST unit can be designed such that the BIST controller can set an operating mode of the semiconductor component upon booting of the semiconductor circuit, i.e., can perform a testing and a configuration, and optionally, if provided in the program code, can test the semiconductor component in subsequent normal operation by execution of functional tests.

During this test operation, functional tests stored in the programmable nonvolatile memory or further functional tests stored in test units, which can be implemented as an ASIC as a component part of the semiconductor circuit, can be fetched and executed. The data determined in test operation can be processed by the BIST controller and stored as operating, test and/or boot parameters in the programmable nonvolatile memory. These processed parameters can be output externally via the standard interface and/or the further test interface provided for test operation.

If a semiconductor circuit is put into operation, module-internal electrical parameters such as, for example, voltages or timings for generating an operating state of the semiconductor circuit or for generating a defined start state, can be set during the boot process by diverse test procedures. Normally the parameters stored in the readable nonvolatile memory can be used for setting the states. Malfunctions or deviations of the specification ranges provided in normal operation of the semiconductor component can necessitate a setting of the semiconductor component that deviates from the setting originally made in production in order to achieve a correct operating state. The BIST unit can process the data determined in test operation such that the data can be processed as boot parameters or test parameters during the next start-up of the semiconductor circuit for test and configuration purposes in a boot sequence of a loaded program code or can be used as test parameters in normal operation during the execution of functional tests in order to enable company-specific settings of the semiconductor component.

In order that the BIST unit can be controlled such that either the standard program code or the program code is loaded into the RAM for execution, flags for control of the BIST controller can be stored in the programmable nonvolatile memory, which flags indicate whether or not the BIST controller is to be started and point to the program code to be loaded.

If a program code from the programmable nonvolatile memory is loaded and executed, this can have at least one boot-up sequence that carries out a testing and setting of the semiconductor component by boot parameters assigned to this sequence. If the program code includes further boot-up sequences, further flags provided in the nonvolatile programmable memory can indicate which boot-up sequence is to be processed.

In this case, the BIST controller can execute the boot-up sequences implemented in the program code until a successful configuration and/or test sequence processing has been achieved, or can execute the boot-up sequence, which can achieve an immediate successful configuration and/or test sequence processing.

In a further embodiment, the data, which are determined in normal operation by the functional tests and are stored as operating parameters in the programmable nonvolatile memory, can be used for module and/or error analysis. For this purpose, the data can be assigned flags, which, for example, can indicate the operating capability of the semiconductor component and/or can permit a read-out of the parameters by a signal code sequence in the mode register set mode via the standard interface of the semiconductor circuit.

The functional tests may, in principle, be driven externally without the BIST controller or be driven and executed by the BIST controller. In this case, in particular, test modes or functional tests, which do not require a memory access via the standard interface of the semiconductor circuit and thus may not impair the normal function of the semiconductor circuit can be providied. The commands to be processed by the BIST controller can generate module-internal test stimuli via a module-internal interface. Functional tests can be executed until the BIST controller codes an externally supplied stop command that halts the functional test, or until the semiconductor memory is switched off.

In accordance with a further embodiment of the invention, an instruction of the program code can be combined from a microcode instruction and a test vector. The microcode instruction can be used for control of the BIST controller and the test vector can be used for sending a test command via the internal test interface. Arranged in the instruction itself is a flag, which can be assigned to the test vector and, in the set state, for example, in the case of a logic "1," can enable the test vector functionality that executes memory accesses to the semiconductor component for interrogation and for setting of operating states of the semiconductor circuit.

Usually, the test vector functionality can be activated in the standard program code. For testing the semiconductor circuit in the fabrication process, test vectors in this case can be sent via the standard interface. The combination of the microcode instruction and the test vector to form a single instruction can enable the instruction to be executed without influencing the semiconductor circuit. Since the test vector functionality in the instruction can be executed via the internal interface and no longer via the standard interface. Microcode instruction and test vector are processed in the same clock cycle.

Consequently, a BIST unit can perform a flexible configuration of a semiconductor component during booting and, in normal operation, can test and set the semiconductor component in a manner near the application without burdening the standard interface and impairing the function of the semiconductor circuit. The BIST unit can thus be used in production as a test and configuration unit; during booting of the semiconductor circuit as an initialization controller, for checking error-free booting, it being possible, in the case of a faulty configuration/initialization, to use various boot-up sequences with sequence-specific boot-up parameters as relaxation parameter sets; in normal operation for permanent monitoring of the module function and for determining operating-specific parameters; generally for introducing functional tests such as monitoring scripts, test programs and initialization scripts, both for production and for operation; and for fetching gathered data for analysis purposes.

BRIEF DESCRIPTION OF THE FIGURES

The invention is explained in more detail below with reference to the figures that are illustrated in the drawings and illustrate exemplary embodiments of the present invention.

In the figures:

FIG. 4 shows a structure of an instruction of a program code; and

FIG. 5 shows an exemplary construction of a program code loaded from the programmable nonvolatile memory.

DETAILED DESCRIPTION

Figure 1:
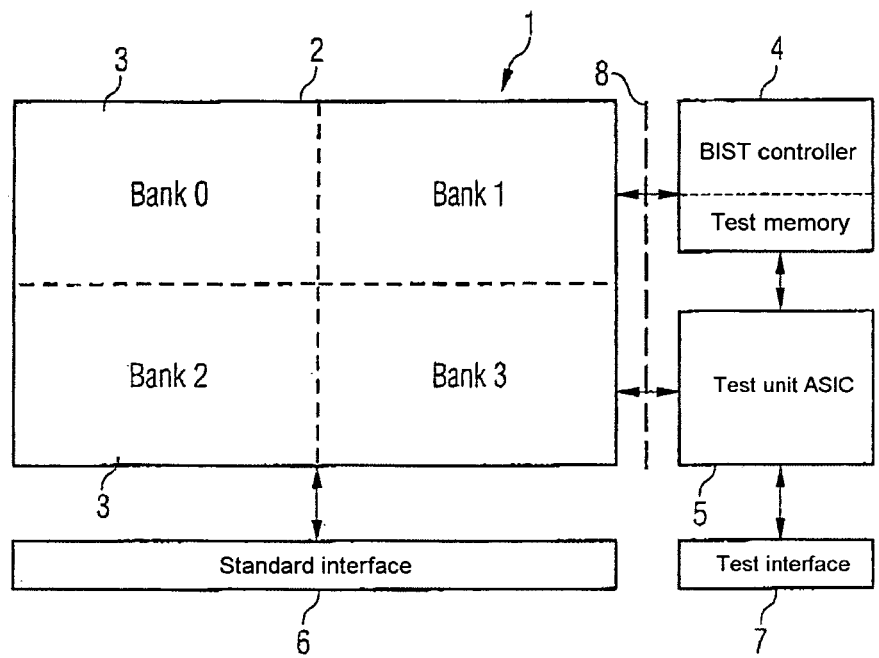
FIG. 1 shows a schematic illustration of the functional units of a semiconductor circuit according to the invention.

FIG. 1 schematically illustrates a semiconductor circuit according to the invention. The semiconductor circuit 1 can have a semiconductor component 2 with four addressable memory banks 3, a BIST unit 4, and a test unit 5 having functional tests. Furthermore, the semiconductor circuit 1 can have a customized standard interface 6 and also a test interface 7. Upon start-up of the semiconductor circuit 1 both in production and in normal operation, the BIST unit 4, driven externally via the standard interface 6 or the test interface 7, can execute program codes stored in the BIST unit 4 and initiate and execute functional tests or further functional tests stored in the test unit 5 so that an initialization and configuration of the semiconductor component 2 can be performed and an application-near setting and testing of the semiconductor component 2 can be made possible in a normal operation of the semiconductor circuit 1.

The standard interface 6 can generally serve for external data, address, and command interchange in normal operation between a controller unit (not illustrated here) and the semiconductor circuit 1. Generally, the test interface 7 is provided for a test operation so that functional tests or the further functional tests of the test unit 5 can be initiated externally at any time and data determined can be output via the test interface 7. Via an internal interface 8, test commands can be sent to the individual memory banks 3 of the semiconductor component 2, which interrogate parameters from memory cells or read in data and/or set operating states of the semiconductor component 2.

Figure 2:
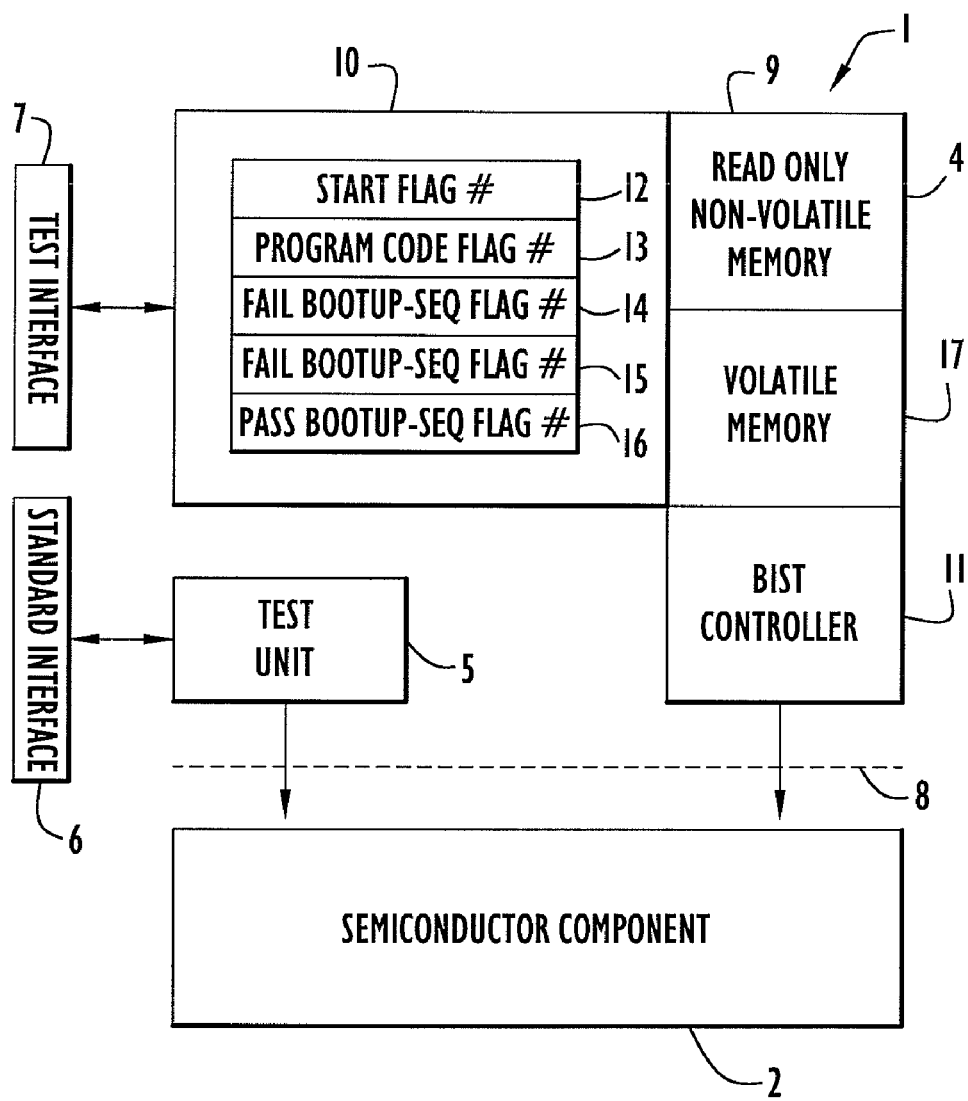
FIG. 2 shows a more detailed schematic illustration of the semiconductor circuit shown in FIG. 1.

The semiconductor circuit 1 illustrated in FIG. 1 is set out in greater detail in FIG. 2. The BIST unit 4 can have a read-only nonvolatile memory 9, which, for example, for test and configuration purposes during the production of the semiconductor circuit 1, can store a standard program code and corresponding standard boot, standard test and/or operating parameters. At least one program code and functional tests, boot, test and operating parameters can be stored in a programmable nonvolatile memory 10. The BIST unit 4 for configuration, testing and application-near setting of the semiconductor component 2 can be controlled by a BIST controller 11, which can be provided with known functional units (not demonstrated and discussed further), such as an ALU (Arithmetic Logic Unit), registers, interface control units, control units, etc.

Flags, which are interrogated and evaluated upon booting of the semiconductor circuit 1 by the BIST controller 11, can be stored in the programmable nonvolatile memory 10. A start flag 12 can indicate whether the BIST controller 11 automatically starts or does not start. In the event of a start, i.e., upon booting of the BIST controller 11, a program code flag 13 can indicate whether the standard program code stored in the read-only nonvolatile memory 9 or the at least one program code stored in the programmable nonvolatile memory 10 can be loaded for execution into a volatile memory 17 assigned to the BIST controller 11.

If a program code is loaded, boot-up flags 14, 15, 16 can be interrogated. The boot-up flags can determine what boot-up sequence in the program code is to be executed. The loaded program code optionally provides, after booting, the loading and execution of functional tests which, in normal operation, test the semiconductor component 2 or perform application-near settings. The functional tests stored in the nonvolatile programmable memory 10, such as, for example, monitoring scripts, configuration scripts, etc., or the further functional tests stored in the test unit 5 may optionally be executed in this case. The test results determined in this case can be evaluated and processed by the BIST controller 11. The processed data can be stored as operating, test and/or boot parameters in the programmable nonvolatile memory 10 for further processing. In this connection, further processing includes, for example, the use of the boot parameters after a restart of the semiconductor circuit 1 in a boot-up sequence, the use of the test parameters for testing and application-near setting of the semiconductor component 2 during normal operation, and the evaluation of the operating parameters for analysis purposes.

The BIST unit 4 can be controlled at any time via the test interface 7 such that the BIST controller 11 can be halted or present data can be output externally via the standard interface 6 or via the test interface 7 so that the present status of the semiconductor circuit 1 can be interrogated and analyzed.

During the configuration and test sequence in boot and normal operation, the BIST controller 11 controls output of the commands to the semiconductor component 2 via the internal interface 8 so that the function of the semiconductor circuit is not impaired, even when carrying out write and read commands. Consequently, the BIST unit 4 can enable a disturbance-free and independent access to the memory areas of the semiconductor component 2.

Figure 3:
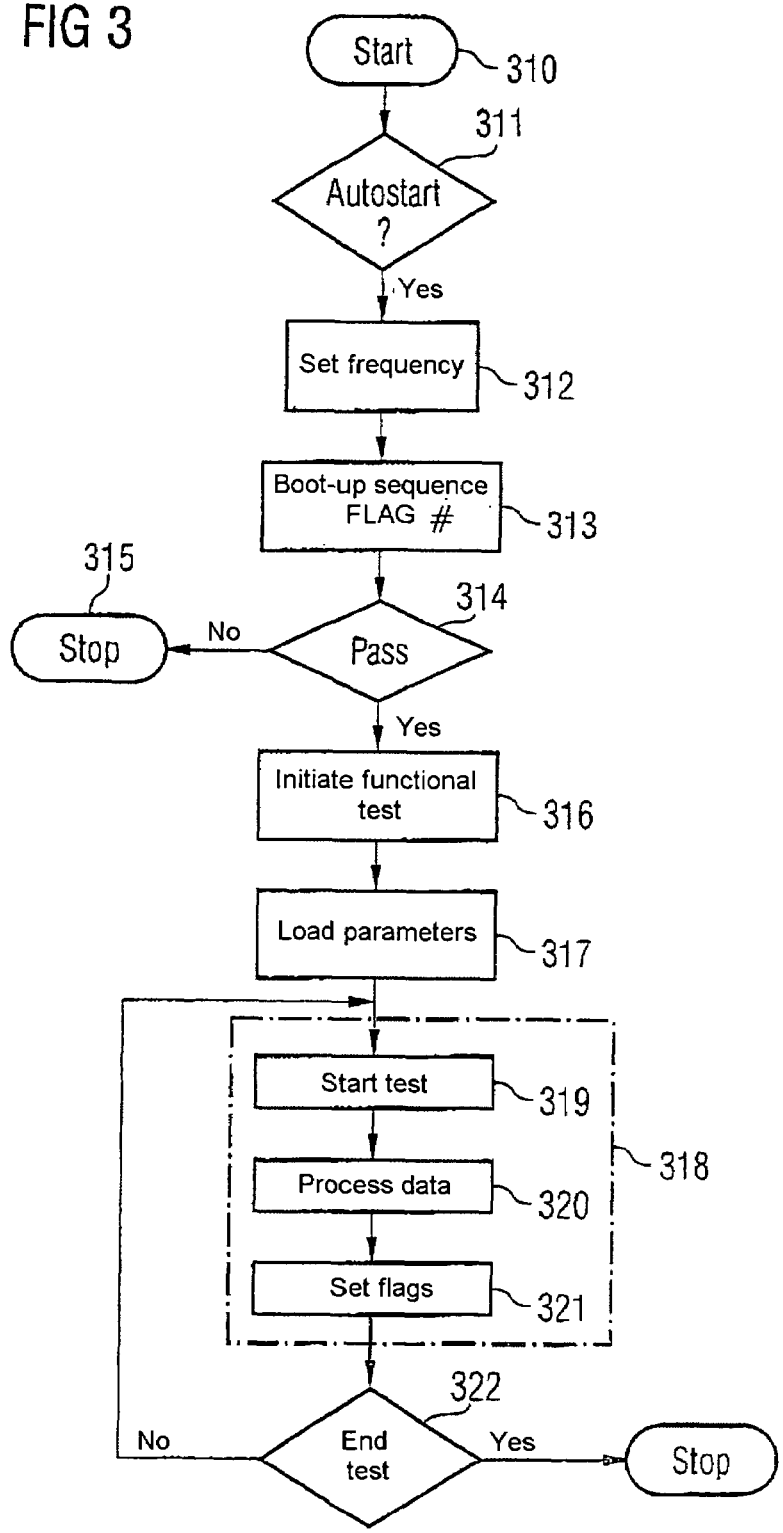
FIG. 3 shows a flowchart of a method according to the invention for booting and subsequent execution of functional tests during a normal operation.

FIG. 3 shows a flowchart of a method according to the invention for booting and subsequent execution of functional tests during a normal operation for testing and application-near setting of the semiconductor circuit 1. A start-up of the semiconductor circuit 1, for example, by current being supplied, can also start the BIST controller 11 assigned to the BIST unit 4 (step 310). The BIST controller 11 can first interrogate the start flag 12 stored in the programmable nonvolatile memory 10, which flag, in the set state, for example, indicates an automatic starting, i.e., booting, of the BIST controller 11, and the program flag 13, which indicates whether the standard program code from the read-only nonvolatile memory 9 or a program code from the programmable nonvolatile memory 10 is to be loaded (step 311).

A clock frequency of the BIST controller 11 and thus the clock rate of test sectors to be processed can be defined by step 312. Even though the definition of the clock frequency is performed during the boot process in this exemplary embodiment, the BIST unit 4 can permit the clock frequency to be set at any desired point in time, since clock rates that are as high as possible are required for test purposes, for example, during booting, and comparatively low clock rates are required for sporadic interrogations of module parameters, in particular, for the purpose of reducing the current consumption.

After the program code has been loaded, the BIST controller 11 can be controlled by the program code. On account of the variable configuration of the program code, various boot-up sequences can be provided in the program code, where step 313 determines which boot-up sequence is to be executed.

For this purpose, the BIST controller 11 can interrogate the further boot-up flags 14, 15, 16 that are stored in the programmable nonvolatile memory 10 and indicate whether and which boot-up sequences provided in the program code are to be executed sequentially until a successful configuration and/or error-free test sequence processing can be achieved. The pass boot-up flag 16 can be used, for example, to control the fact that that boot-up sequence implemented in the program code is executed, which can achieve a successful configuration and/or error-free test sequence processing.

Respective sequence-specific boot parameters stored in the programmable nonvolatile memory 10 can be used during the processing of the boot-up sequences. Successful booting has the effect, in step 314, that the semiconductor circuit 1 changes to a monitor operation. If none of the boot-up sequences results in a successful configuration, the semiconductor circuit 1 can be halted (step 315).

In the monitor mode, the functional tests provided in the program code can be initiated, i.e., functional tests stored in the programmable nonvolatile memory area 10 or functional tests stored in the test unit 5 are loaded and executed (step 316). For application-near setting or for testing of the semiconductor circuit 1, the necessary test parameters can be loaded in step 317.

In step 318, a loaded functional test can be executed. First, the functional test can be started in step 319 and data determined can be processed in step 320. The data that have been determined and processed further may be assigned, in step 321, further flags that can indicate an operating capability of the semiconductor component and/or permit a read-out of the parameters by a signal code sequence in the mode register set mode via the standard interface 6 or the test interface 7 of the semiconductor circuit 1.

The functional test can be executed until the BIST controller 11 codes an externally supplied stop command that halts the functional test (step 322) or until the semiconductor circuit 1 is switched off.

The structure of an instruction of a program code is illustrated for example in FIG. 4. The instruction has a structure in which individual bits or bit groups of a microcode instruction and of a test vector are combined. The microcode instruction, which controls the BIST controller 11, can have, in field 181, a bit group for controlling an ALU (Arithmetic Logic Unit), which can convert determined and/or stored data into absolute and relative mean values and also can calculate conditional or unconditional, relative and absolute microcode address jumps to the next microcode instruction to be loaded. Internal registers can be addressed by bits in the field 182. Furthermore, a bit group that controls read and write actions for storing calculated data and/or for loading data can be provided in the field 183. The bit group in the field 184 can be used for sending test modes during the execution of the microcode instruction part without sending them by the customary manner of application of a test vector.

The test vector can have, in the field 191, a plurality of bit groups, which, for the setting of operating states of the semiconductor component 2, can execute a timing-critical write-read addressing of the memory banks of the semiconductor component 2, during which, for example, binary data coded as voltage values can be written or read in an address-dependent manner. Furthermore, in the field 191, bits for the activation of specific functional tests, which store data in specific memory areas of the semiconductor component 2 or fetch data from specific memory areas of the semiconductor component 2, can be provided.

For executing the test vector, the instruction can have a bit in the field 192, which can enable the test vector functionality. The combination of microcode instruction and test vector in one instruction can permit the performance of tests and configurations of the semiconductor circuit 1 in normal operation without the function of the semiconductor circuit 1 being impaired, since, by these instructions, module-internal test stimuli can be sent via the internal interface 8 and the standard interface may not be used for test and configuration purposes.

The temporal sequence of the execution of the individual commands in the microcode instruction and test vector (fields 18 and 19) can be distributed so that test results, after a test vector has been sent, can subsequently be evaluated and processed by a correspondingly chosen microcode instruction. Usually, a test vector can be executed during a clock cycle, whereas the microcode instruction can be divided in subordinate clock segments (phases) in order to fetch data to be converted from registers or to load them from an assigned memory, to convert them with one another and subsequently to write them back or to store them.

FIG. 5 shows the construction of a program code loaded from the programmable nonvolatile memory 10. The program code can have program lines 50 that in each case can include an instruction from the combination of a microcode instruction and a test vector instruction and can be processed sequentially.

The program code can include, in fields 51, 52, 53, a plurality of boot-up sequences that can be executed in a manner dependent on the state of boot-up flags to be interrogated, as described above. If a boot-up sequence leads to the successful configuration and/or error-free test sequence processing, a jump can be made to an address 100 into a field 54. At this point, test parameters can be loaded from the programmable nonvolatile memory 10 and can be used in a subsequent test script to be executed in field 55. After the end of the test script, the test script can be restarted and executed in an endless fashion.

The BIST unit can be used as a flexible, freely programmable test system that can be used in both production, and during normal operation of the semiconductor circuit by a customer.

The above description of the exemplary embodiments in line with the present invention serves merely for illustrative purposes and not to limit the invention. The invention allows various changes and modifications without departing from the scope of the invention and its equivalents.

LIST OF REFERENCE SYMBOLS

| | |
|---|---|
| 1 | Semiconductor circuit |
| 2 | Semiconductor component |
| 3 | Memory bank |
| 4 | BIST unit |
| 5 | Test unit |
| 6 | Standard interface |
| 7 | Test interface |
| 8 | Internal interface |
| 9 | Readable nonvolatile memory |
| 10 | Programmable nonvolatile memory |
| 11 | BIST controller |
| 12 | Flag |
| 13 | Flag |
| 14 | Flag |
| 15 | Flag |
| 16 | Flag |
| 17 | Volatile memory |
| 18 | Microcode instruction |
| 19 | Test vector |

What is claimed is:

1. A semiconductor circuit having a standard interface for external data, address or command interchange in normal operation and a test interface provided for a test operation, with a semiconductor memory and with a test control unit assigned to the semiconductor memory, comprising:
a controller for initialization, testing and application-near setting of the semiconductor memory in the normal operation;
a read-only nonvolatile memory, the read-only nonvolatile memory storing a standard program code for configuration and for testing of the semiconductor memory, standard test, and standard boot parameters;
a programmable nonvolatile memory, the programmable nonvolatile memory storing at least one further program code for configuration and for testing of the semiconductor memory, functional tests, operating parameters, test and boot parameters; and
a volatile memory, the volatile memory being assigned to the controller, and during booting, an execution program code selected from the group including: the standard program code and the at least one further program code being loaded for execution into the volatile memory, the controller performing a configuration during booting and optionally a testing of the semiconductor memory in subsequent normal operation by execution of functional tests and storing the data determined during testing as operating, test or boot parameters in the programmable nonvolatile memory or outputting the data externally via the standard interface or the test interface of the semiconductor circuit.

2. The semiconductor circuit as claimed in claim 1, wherein flags for control of the controller are stored in the programmable nonvolatile memory, the controller, depending on the status of the flags, automatically being started or not being started, and upon automatic starting, loading the execution program code for execution into the volatile memory.

3. The semiconductor circuit as claimed in claim 1, wherein the semiconductor memory is configurable, the semiconductor circuit further comprising:
a plurality of boot-up sequences; and
a plurality of flags, being arranged in the programmable nonvolatile memory, each flag being assigned to an individual one of the plurality of boot-up sequences and indicating which of the boot-up sequences implemented in the execution program code are to be executed by the controller so that each of the boot-up sequences and configurations of the semiconductor memory can be initiated.

4. The semiconductor circuit as claimed in claim 1, further comprising:
test units having further functional tests, the further functional tests capable of being called up both by the controller and externally via the standard interface or via the test interface.

5. The semiconductor circuit as claimed in claim 1, further comprising:
a module-internal interface arranged between the test control unit and the semiconductor memory, the controller outputting commands of the functional tests to the semiconductor memory via the module-internal interface and receiving the data output by the semiconductor memory.

6. The semiconductor circuit as claimed in claim 1, wherein the read-only nonvolatile memory is a ROM (Read-Only Memory).

7. The semiconductor circuit as claimed in claim 1, wherein the programmable nonvolatile memory is a FLASH memory.

8. The semiconductor circuit as claimed in claim 4, wherein the test units are implemented as at least one ASIC (Application Specific Integrated Circuit) in the semiconductor circuit.

9. The semiconductor circuit as claimed in claim 5, wherein instructions of the execution program code have a structure in which individual bits or bit groups of a microcode instruction for control of the controller are combined with individual bits or bit groups of a test vector that sends a test command to the semiconductor memory via the module-internal interface.

10. The semiconductor circuit as claimed in claim 9, wherein the instructions have at least one additional bit or a bit group which is set for activation of a test vector.

11. A method for testing, monitoring and application-near setting of a semiconductor circuit that uses a standard interface for external data, address or command interchange in a normal operation and a test interface for a test operation, with a semiconductor memory, comprising: in response to the semiconductor circuit booting, interrogating boot-up flags stored in a programmable nonvolatile memory via a test control unit assigned to the semiconductor memory for configuration and test purposes, the boot-up flags including at least: a start-up flag for determining whether a controller of the test control unit automatically boots and an execution program code flag for determining an execution program code selected from the group including: a start program code from a read-only non-volatile memory and a further program code from the programmable non-volatile memory to be loaded by the controller into a volatile memory for execution, wherein each boot-up flag is assigned a boot-up sequence;
depending on the status of the start-up flag, determining a further start-up flag as to whether a controller of the test control unit automatically boots or does not boot;
depending on the status of the execution program code flag and in response to the controller booting, determining a further execution program code flag for determining an further execution program code selected from the group including: a start program code from a read-only non-volatile memory and a further program code from the programmable non-volatile memory to be loaded by the controller into a volatile memory for execution, the further flags defining further boot-up flags;

in response to the controller booting, executing at least one boot-up sequence which is implemented in the execution program code and configures an operating mode of the semiconductor memory; and subsequent to the controller booting and being in normal operation, optionally initiating and executing functional tests provided in the execution program code.

12. The method as claimed in claim 11, wherein upon booting of the semiconductor circuit or at any arbitrary point in time thereafter, the test control unit defines the clock frequency of the controller and the rate of test vectors to be processed.

13. The method as claimed in claim 11, wherein the controller interrogates and evaluates further boot-up flags ,stored in the programmable nonvolatile memory and assigned to further boot-up sequences, and executes those boot-up sequences implemented in the loaded execution program code for which the further flags are set.

14. The method as claimed in claim 11, wherein the at least one boot-up sequence, for configuration of an operating mode and testing of the semiconductor memory, uses sequence-specific boot parameters stored in the programmable nonvolatile memory.

15. The method as claimed in claim 13, wherein the evaluation of the further flags assigned to the further boot-up sequences controls the controller to sequentially execute the boot-up sequences implemented in the execution program code until a successful configuration or error-free test sequence processing is attained.

16. The method as claimed in claim 11, wherein the at least one boot-up sequence comprises a pass boot-up sequence, the method further comprising:

identifying the pass boot-up sequence in response to the semiconductor memory attaining a successful processing of at least one of: a configuration sequence and a test sequence, the pass boot-up sequence being identified by the flag assigned to the sequence successfully processed.

17. The method as claimed in claim 13, wherein the evaluation of the further flags assigned to the boot-up sequences controls the controller to execute the boot-up sequence implemented as a pass boot-up sequence in the execution program code.

18. The method as claimed in claim 11, wherein the controller loads the functional tests provided in the execution program code from the programmable nonvolatile memory or from a test unit of the semiconductor circuit that is implemented as an ASIC (Application Specific Integrated Circuit).

19. The method as claimed in claim 11, wherein in normal operation, data determined by the execution of the functional tests are processed by the controller and stored as operating, test or boot parameters in the programmable nonvolatile memory or output externally via the standard interface or the test interface of the semiconductor circuit.

20. The method as claimed in claim 19, wherein the boot parameters generated can be used in an arbitrary boot sequence in the event of a renewed booting of the semiconductor memory.

21. The method as claimed in claim 19, wherein the data determined in normal operation can be used for at least one of: module and error analysis.

22. The method as claimed in claim 19, wherein the stored operating parameters are assigned flags which indicate at least one of: an operational capability of the semiconductor module and permit a read-out of the parameters by a signal code sequence in a mode register set mode via the standard interface of the semiconductor circuit.

23. The method as claimed in claim 11, wherein the functional tests are executed until the controller receives an externally supplied stop command that halts the functional tests or until the semiconductor circuit is switched off.

24. The method as claimed in claim 11, wherein coded commands which interrupt, halt or stop the execution of the functional tests or fetch present operating parameters via the test interface can be applied via the test interface.

25. The method as claimed in claim 11, wherein the functional tests can be programmed in the programmable nonvolatile memory area via the test interface.

26. The method as claimed in claim 11, wherein an instruction of the execution program code is combined from a microcode instruction for control of the controller and a test vector that sends a test command to the semiconductor memory via the module-internal interface, and wherein a flag assigned to the test vector in the instruction indicates whether or not the test vector is executed.

27. The method as claimed in claim 26, wherein the test vector is executed in the event the test vector flag is set to a logic "1".

28. The method as claimed in claim 27, wherein with the test vector flag set, the test vector and the microcode instruction are processed in the same clock cycle.

29. The method as claimed in claim 26, wherein the microcode instruction controls at least one ALU (arithmetic logic unit) of the controller, converts determined or stored data into absolute or relative mean values and calculates conditional or unconditional, relative and absolute microcode address jumps to a next microcode instruction to be loaded.

30. The method as claimed in claim 29, wherein the ALU comprises at least one internal register and the microcode instruction addresses contents of the at least one internal register.

31. The method as claimed in claim 26, wherein the microcode instruction executes read or write actions for loading or for storage of data.

32. The method as claimed in claim 26, wherein the semiconductor memory comprises at least one memory bank and wherein the test vector is operable to, interrogate and to set operating states of the semiconductor memory, the method further comprising:

executing a timing-critical addressing of at least one memory bank via the test vector and writing or reading binary data coded as voltage values in an address-dependent manner.

33. The method as claimed in claim 26, wherein the test vector activates functional tests, which store data in defined memory areas or fetch data from defined memory areas.

34. The method as claimed in claim 26, wherein a cyclic processing of the test vector and of the microcode instruction to be processed in a pair-wise manner, within a subsequent clock cycle, is coordinated to convert test results with data collected from a previous clock cycle.

* * * * *